(12) United States Patent
Lee et al.

(10) Patent No.: US 7,719,634 B2
(45) Date of Patent: May 18, 2010

(54) SENSOR, THIN FILM TRANSISTOR ARRAY PANEL, AND DISPLAY PANEL INCLUDING THE SENSOR

(75) Inventors: Ki-Chan Lee, Suwon-si (KR); Hyun-Seok Ko, Seoul (KR); Yun-Jae Park, Yongin-si (KR); Seung-Hwan Moon, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/045,963

(22) Filed: Mar. 11, 2008

(65) Prior Publication Data
US 2008/0158481 A1 Jul. 3, 2008

Related U.S. Application Data

(62) Division of application No. 11/267,000, filed on Nov. 4, 2005, now Pat. No. 7,425,725.

(30) Foreign Application Priority Data

Jan. 19, 2005 (KR) .................. 10-2005-0004879

(51) Int. Cl.
*G02F 1/133* (2006.01)
(52) U.S. Cl. ........................................ 349/72
(58) Field of Classification Search ............. 349/72, 349/199, 41–43; 257/59, 72
See application file for complete search history.

(56) References Cited

U.S. PATENT DOCUMENTS

| 5,097,304 | A | 3/1992 | Itabashi et al. |
|---|---|---|---|
| 5,366,921 | A | 11/1994 | Tashiro |
| 5,886,762 | A | 3/1999 | Lee et al. |
| 6,388,725 | B2 | 5/2002 | Ohta et al. |
| 6,414,740 | B1 * | 7/2002 | Hosoyamada ............. 349/161 |
| 6,423,973 | B2 | 7/2002 | Choo et al. |
| 6,646,692 | B2 | 11/2003 | Yamazaki et al. |
| 6,678,033 | B1 * | 1/2004 | Brandt et al. ............. 349/161 |
| 7,158,199 | B2 * | 1/2007 | Zhang et al. ............. 349/116 |
| 7,453,383 | B2 * | 11/2008 | Jo ............................. 341/144 |
| 2001/0019373 | A1 | 9/2001 | Kobayashi et al. |
| 2002/0009538 | A1 | 1/2002 | Arai |
| 2002/0142478 | A1 | 10/2002 | Wado et al. |
| 2002/0190253 | A1 | 12/2002 | Tsujimura et al. |
| 2002/0191138 | A1 | 12/2002 | Matsumoto et al. |
| 2003/0015767 | A1 | 1/2003 | Emrick et al. |
| 2003/0052848 | A1 | 3/2003 | Yamaguchi |
| 2003/0193639 | A1 | 10/2003 | Nagano et al. |
| 2005/0213013 | A1 | 9/2005 | Chen et al. |
| 2005/0275616 | A1 | 12/2005 | Park et al. |
| 2007/0012897 | A1 | 1/2007 | Lee et al. |
| 2007/0018926 | A1 | 1/2007 | Shin et al. |

\* cited by examiner

*Primary Examiner*—Dung T. Nguyen
(74) *Attorney, Agent, or Firm*—Cantor Colburn LLP

(57) ABSTRACT

A sensor is provided, which includes a substrate, an insulating layer formed on the substrate, a semiconductor formed on the insulating layer, an ohmic contact formed on the semiconductor, a sensor input electrode and a sensor output electrode formed on the ohmic contact, and a passivation layer formed on the sensor input electrode and the sensor output electrode. A sensor control electrode may also be formed between the substrate and the insulating layer. A thin film transistor array panel including the sensor and a liquid crystal display panel including the sensor are further provided.

7 Claims, 11 Drawing Sheets

SENSOR, THIN FILM TRANSISTOR ARRAY PANEL, AND DISPLAY PANEL INCLUDING THE SENSOR

This application claims priority to Korean Patent Application No. 10-2005-0004879, filed on Jan. 19, 2005 and all the benefits accruing therefrom under 35 U.S.C. §119, and the contents of which in its entirety are herein incorporated by reference.

BACKGROUND OF THE INVENTION (a) Field of the Invention

The present invention relates to a sensor, a thin film transistor array panel including the sensor, and a display panel including the sensor. More particularly, the present invention relates to an improved temperature sensor, a thin film transistor array panel including the temperature sensor, and a display panel including the temperature sensor.

(b) Description of the Related Art

Display devices used for monitors of computers and television sets generally include self-emitting display devices such as organic light emitting displays ("OLEDs"), vacuum fluorescent displays ("VFDs"), field emission displays ("FEDs"), and plasma panel displays ("PDPs"), and non-emitting display devices such as liquid crystal displays ("LCDs") requiring an external light source.

An LCD includes two panels provided with field-generating electrodes and a liquid crystal ("LC") layer having dielectric anisotropy interposed therebetween. The field-generating electrodes supplied with electric voltages generate an electric field across the LC layer, and the light transmittance of the LC layer varies depending on the strength of the applied field, which can be controlled by the applied voltages. Accordingly, desired images are displayed by adjusting the applied voltages.

The light for an LCD may be provided by lamps equipped at the LCD or may instead be natural light.

Since optical characteristics of the liquid crystal within the LC layer are changed based on temperature, a temperature variation of the LCD has to be considered for improving reliability thereof.

That is, since the optical characteristics such as refractive index, dielectric constant, coefficient of elasticity, and viscosity of the liquid crystal are in inverse proportion to thermalization energy of liquid crystal molecules within the LC layer, values of the optical characteristics decrease as the temperature of the liquid crystal becomes higher. Thus, to optimize a state of the liquid crystal for good driving of the LCD, the temperature variation of the LCD due to internal heating and temperature within the ambient environment has to be detected.

A temperature sensor is disposed on a printed circuit board ("PCB") mounted with a plurality of driving circuits to detect a temperature variation of the LCD. However, the PCB is generally disposed on a rear side of the LCD, on which the lamps and electric elements generating heat are disposed, instead of a front side thereof, on which the LC layer is installed, adjacent to the outside. Thus, the temperature sensor detects a temperature at the rear side which has a large temperature deviation caused by the heat. As a result, since the detected temperature by the temperature sensor has a large difference with respect to a temperature of the LC layer, temperature compensation of the LCD based on the temperature of the LC layer is not precisely achieved. In addition, since the temperature sensor is separately installed on the PCB, design redundancy of the LCD and manufacturing cost are increased.

BRIEF SUMMARY OF THE INVENTION

The present invention solves the problems of conventional techniques.

In an exemplary embodiment of the present invention, a sensor is provided, which includes a sensor control electrode formed on a substrate, an insulating layer formed on the sensor control electrode, a semiconductor formed on the insulating layer, an ohmic contact formed on the semiconductor, a sensor input electrode and a sensor output electrode formed on the ohmic contact, and a passivation layer formed on the sensor input electrode and the sensor output electrode.

The insulating layer may be further formed on portions of the substrate not covered by the sensor control electrode. The passivation layer may be further formed on portions of the semiconductor not covered by the ohmic contact, sensor input electrode, or sensor output electrode, and on portions of the insulating layer not covered by the semiconductor, ohmic contact, sensor input electrode, and sensor output electrode.

The sensor input electrode may include a plurality of first branches spaced by a predetermined distance and formed as a comb, and the sensor output electrode includes a plurality of second branches spaced by a predetermined distance and formed as a comb, wherein the first branches are engaged with the second branches through the semiconductor, respectively. The first branches may be alternately arranged with respect to the second branches.

The sensor may include a first signal line connected to the sensor control electrode, a second signal line connected to the sensor input electrode, and a third signal line connected to the sensor output electrode. The passivation layer may be further formed on the sensor control electrode and may include a first contact hole exposing a portion of the first signal line, a second contact hole exposing a portion of the second signal line, and a third contact hole exposing a portion of the third signal line.

The sensor may further include contact assistants connecting the first signal line and second signal line through the first and second contact holes, respectively, and the contact assistants may be made of indium tin oxide ("ITO") or indium zinc oxide ("IZO"). The second signal line may be connected to a voltage through the second contact hole, and the voltage may be a ground voltage. The third signal line may output a sensing signal, and the semiconductor may be made of amorphous silicon. The sensor may thus be a diode type of temperature sensor.

In a further embodiment of the present invention, a sensor is provided, which includes an insulating layer formed on a substrate, a semiconductor formed on the insulating layer, an ohmic contact formed on the semiconductor, a sensor input electrode and a sensor output electrode formed on the ohmic contact, and a passivation layer formed on the sensor input electrode and the sensor output electrode.

The insulating layer may be further formed on portions of the substrate not covered by the sensor control electrode. The passivation layer may be further formed on portions of the semiconductor not covered by the ohmic contact, sensor input electrode, or sensor output electrode, and on portions of the insulating layer not covered by the semiconductor, ohmic contact, sensor input electrode, and sensor output electrode.

The sensor input electrode may include a plurality of first branches spaced by a predetermined distance and formed as a comb and the sensor output electrode may include a plurality of second branches spaced by a predetermined distance and formed as a comb, wherein the first branches are engaged with the second branches through the semiconductor, respectively. The first branches may be alternately arranged with respect to the second branches.

The sensor may further include a sensor input line connected to the sensor input electrode and a sensor output line connected to the sensor output electrode, and the passivation layer may include a first contact hole exposing a portion of the sensor input line and a second contact hole exposing a portion of the sensor output line.

The sensor input line may be connected to a voltage through the first contact hole, and the voltage may be a ground. The sensor output line may output a sensing signal. The sensor may thus be a resistor type of temperature sensor.

In a still further embodiment of the present invention, a thin film transistor array panel is provided, which includes a gate line and a sensor control electrode formed on a substrate, an insulating layer formed on the gate line and the sensor control electrode, and a semiconductor formed on the insulating layer, an ohmic contact formed on the semiconductor. A data line, a drain electrode, a sensor input electrode, and a sensor output electrode are formed on the ohmic contact, and a passivation layer is formed on the data line, the drain electrode, the sensor input electrode, and the sensor output electrode.

The sensor input electrode may include a plurality of first branches spaced by a predetermined distance and formed as a comb and the sensor output electrode may include a plurality of second branches spaced by a predetermined distance and formed as a comb, wherein the first branches are engaged with the second branches through the semiconductor, respectively.

The panel may further include a sensor control line connected to the sensor control electrode, a sensor input line connected to the sensor input electrode, and a sensor output line connected to the sensor output electrode. The passivation layer may further be formed on the sensor control electrode and may include a first contact hole exposing a portion of the sensor control line, a second contact hole exposing a portion of the sensor input line, and a third contact hole exposing a portion of the sensor output line, and it may further include a fourth contact hole exposing a portion of the drain electrode.

The panel may further include a pixel electrode connected to the drain electrode through the fourth contact hole, and contact assistants connected to the sensor control line, the sensor input line, and the sensor output line through the first, second, and third contact holes, respectively. The contact assistants may be formed on the same layer as the pixel electrode.

The sensor control electrode, the sensor input electrode, and the sensor output electrode may be formed on a border of the panel. The sensor control electrode, sensor input electrode, and sensor output electrode form part of a diode type of temperature sensor.

In a still further embodiment of the present invention, a thin film transistor array panel is provided, which includes a gate line formed on a substrate, an insulating layer formed on the gate line, a semiconductor formed on the insulating layer, an ohmic contact formed on the semiconductor. A data line, a drain electrode, a sensor input electrode, and a sensor output electrode are formed on the ohmic contact, and a passivation layer is formed on the data line, the drain electrode, the sensor input electrode, and the sensor output electrode.

The sensor input electrode includes a plurality of first branches spaced by a predetermined distance and formed as a comb, and the sensor output electrode includes a plurality of second branches spaced by a predetermined distance and formed as a comb, wherein the first branches are engaged with the second branches through the semiconductor, respectively.

The panel may further include a sensor input line connected to the sensor input electrode and a sensor output line connected to the sensor output electrode, wherein the passivation layer comprises a first contact hole exposing a portion of the sensor input line and a second contact hole exposing a portion of the sensor output line. The passivation layer may further include a third contact hole exposing a portion of the drain electrode.

The panel may further include a pixel electrode connected to the drain electrode through the third contact hole. The panel may further include contact assistants connected to the sensor input line and the sensor output line through the first and second contact holes, respectively, and the contact assistants may be formed on the same layer as the pixel electrode.

The sensor input electrode and the sensor output electrode may be formed on a border of the panel. The sensor input electrode and the sensor output electrode form part of a resistor type of temperature sensor.

In yet a further embodiment of the present invention, a liquid crystal display panel includes a first panel, a second panel, a liquid crystal layer disposed between the first panel and the second panel, and a temperature sensor formed on a first surface of the first panel, the first surface of the first panel facing the liquid crystal layer.

The first panel may be a thin film transistor array panel. The temperature sensor may be formed on a non-display region of the first panel. A plurality of temperature sensors may be formed on the first surface of the first panel.

The first panel may include at least one data line, and the temperature sensor may include a sensor input electrode and a sensor output electrode formed within a same layer of the first panel as the data line. The first panel may include a substrate and at least one gate line formed on the substrate, and the temperature sensor may include a sensor control electrode formed on the substrate within a same layer of the first panel as the gate line.

BRIEF DESCRIPTION OF THE DRAWINGS

The present invention will become more apparent by describing preferred embodiments thereof in detail with reference to the accompanying drawings, in which.

DETAILED DESCRIPTION OF THE INVENTION

Figure 1:
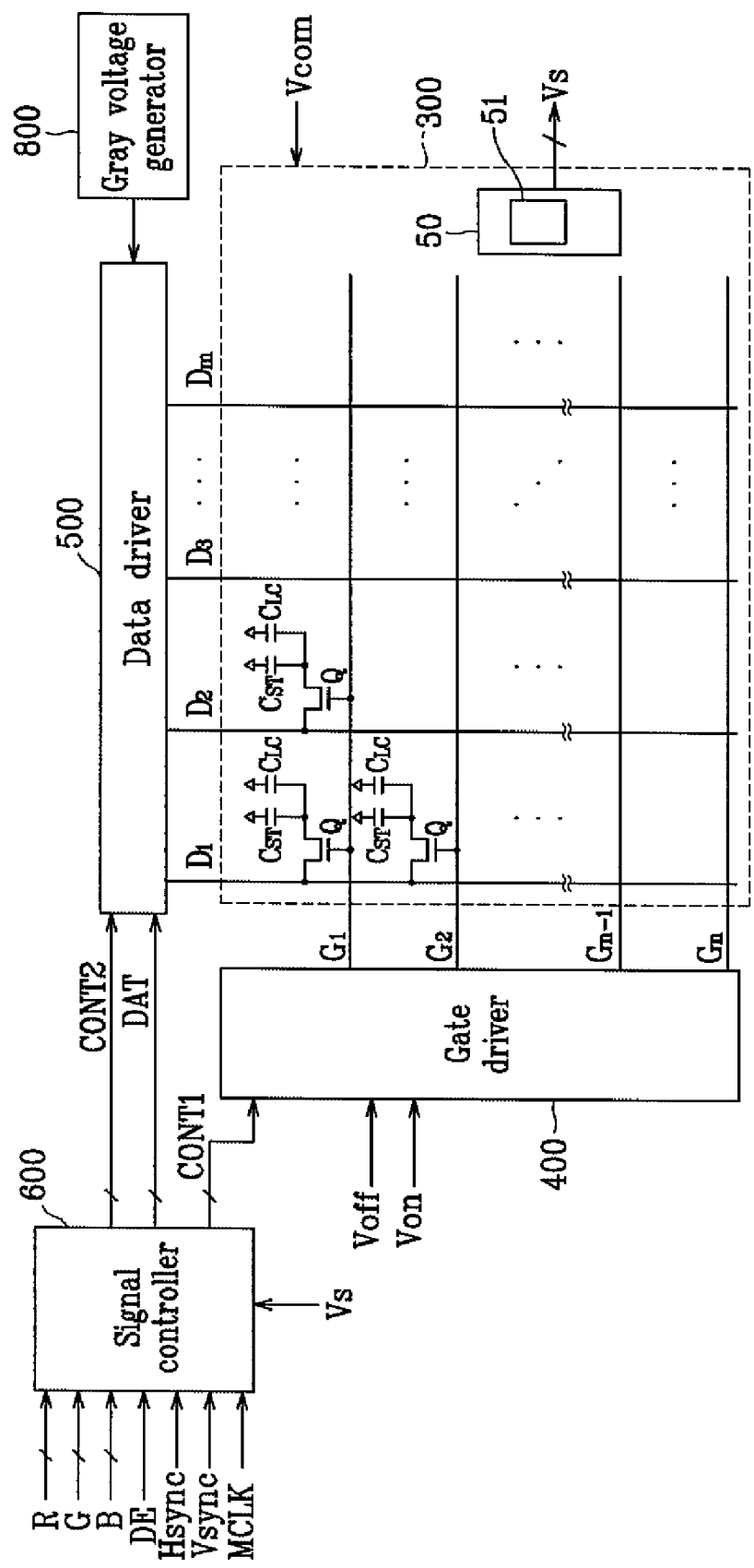
FIG. 1 is a block diagram of an exemplary embodiment of an LCD according to the present invention.

The present invention will be described more fully hereinafter with reference to the accompanying drawings, in which preferred embodiments of the invention are shown. This invention may, however, be embodied in many different forms and should not be construed as limited to the embodiments set forth herein.

In the drawings, the thickness of layers and regions are exaggerated for clarity. Like numerals refer to like elements throughout. It will be understood that when an element such as a layer, film, region, substrate, or panel is referred to as being "on" another element, it can be directly on the other element or intervening elements may also be present. In contrast, when an element is referred to as being "directly on" another element, there are no intervening elements present.

Sensors and thin film transistor ("TFT") array panels having a sensor according to embodiments of the present invention will be described with reference to the drawings.

Figure 2:
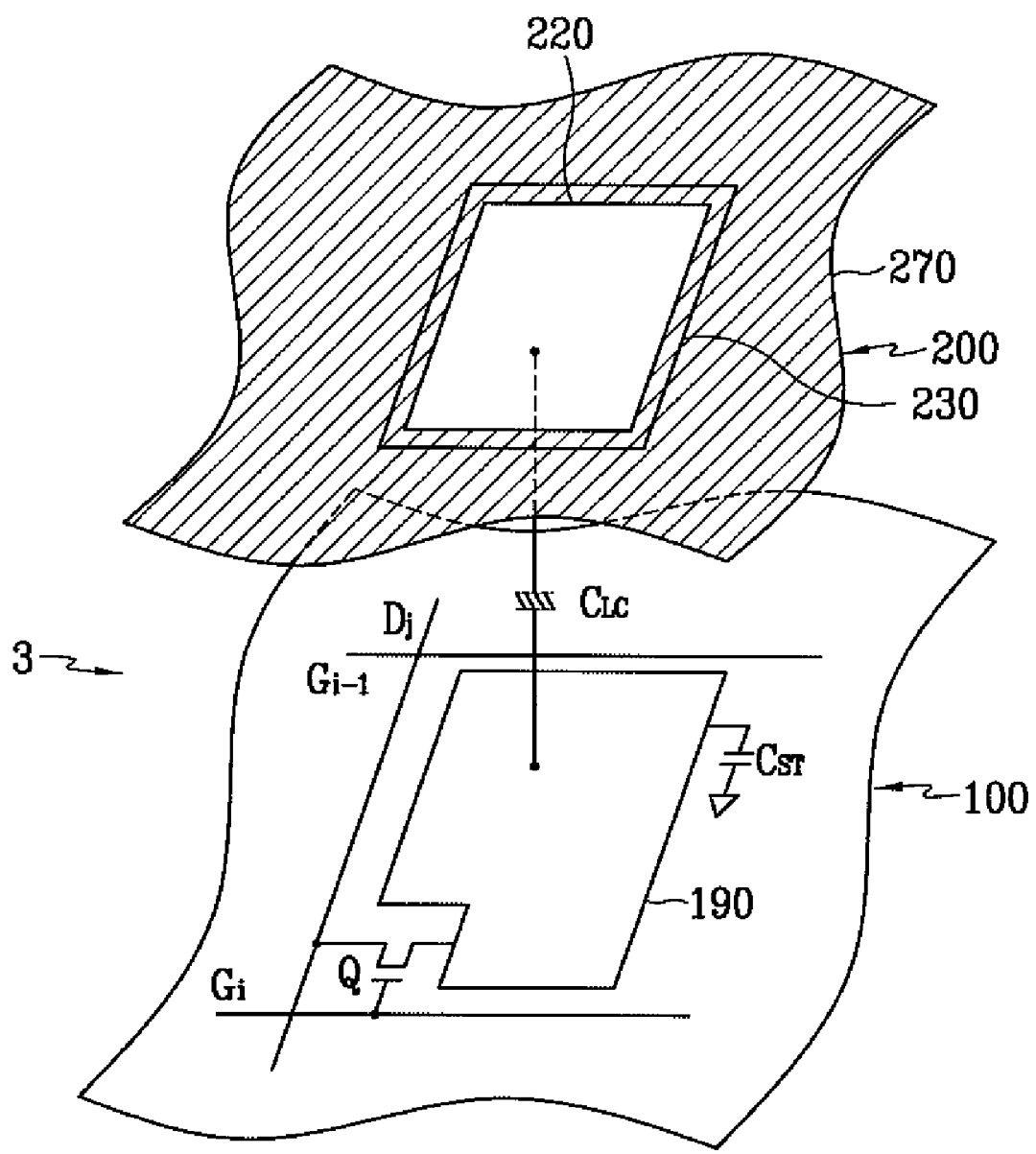
FIG. 2 is an equivalent circuit diagram of an exemplary embodiment of a pixel of an LCD according to the present invention.
Figure 3:
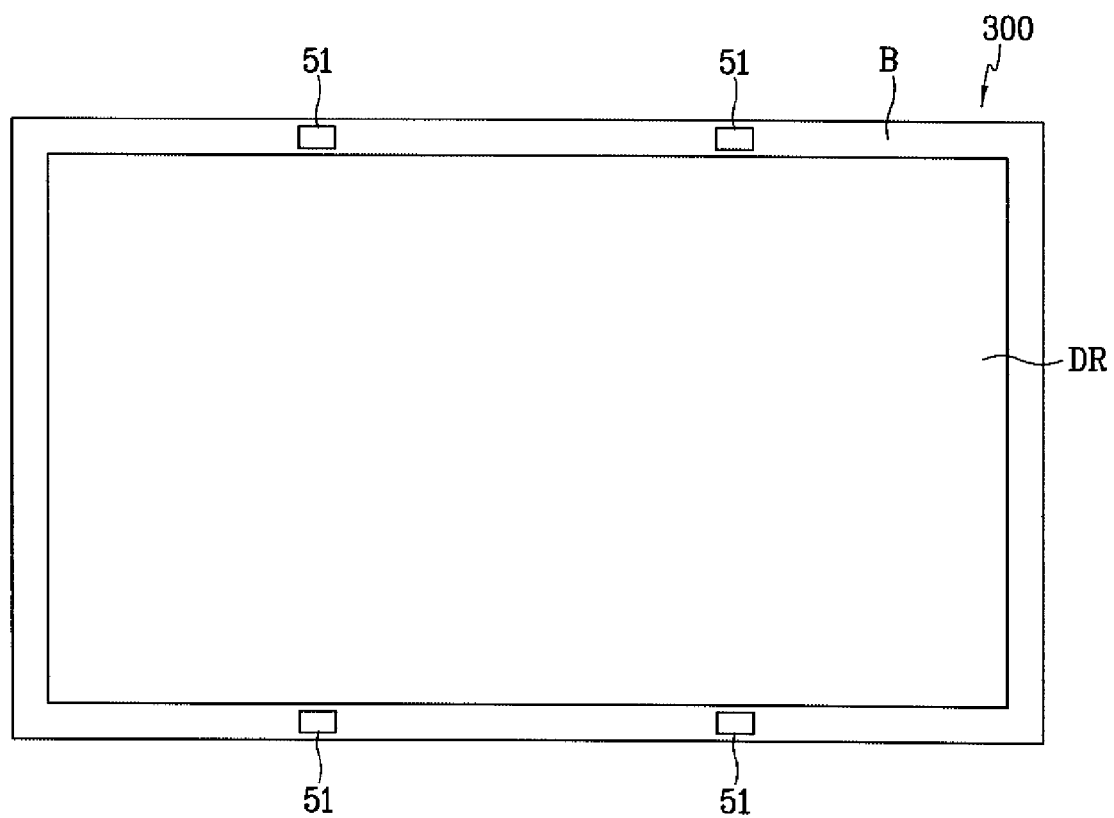
FIG. 3 is a plan view of an exemplary embodiment of an LCD according to the present invention.

FIG. 1 is a block diagram of an exemplary embodiment of an LCD according to the present invention, FIG. 2 is an equivalent circuit diagram of an exemplary embodiment of a pixel of an LCD according to the present invention, and FIG. 3 is a plan view of an exemplary embodiment of an LCD according to the present invention.

Referring to FIG. 1, an LCD includes an LC panel assembly 300, a gate driver 400 and a data driver 500 that are connected to the LC panel assembly, a gray voltage generator 800 connected to the data driver 500, a temperature sensing unit 50, and a signal controller 600 controlling the above-described elements.

With additional reference to the circuital views of FIGS. 1 and 2, the LC panel assembly 300 includes a lower panel 100 as a thin film transistor ("TFT") panel, an upper panel 200 as a color filter panel, where the panels 100 and 200 face each other, and a liquid crystal layer 3 interposed therebetween. The LC panel assembly 300 further includes a plurality of display signal lines G1-Gn and D1-Dm and a plurality of pixels connected thereto and arranged substantially in a matrix.

The display signal lines G1-Gn and D1-Dm are provided on the lower panel 100, and include a plurality of gate lines G1-Gn transmitting gate signals (also referred to as "scanning signals") and a plurality of data lines D1-Dm transmitting data signals. The gate lines G1-Gn extend substantially in a row direction and are substantially parallel to each other, while the data lines D1-Dm extend substantially in a column direction and are substantially parallel to each other.

Each pixel includes a switching element Q connected to the display signal lines G1-Gn and D1-Dm, and an LC capacitor $C_{LC}$ and a storage capacitor $C_{ST}$ that are connected to the switching element Q. In an alternative embodiment, the storage capacitor $C_{ST}$ may be omitted if it is unnecessary.

The switching element Q, such as a TFT, is provided on the lower panel 100 and has three terminals including a control terminal connected to one of the gate lines G1-Gn, an input terminal connected to one of the data lines D1-Dm, and an output terminal connected to the LC capacitor $C_{LC}$ and the storage capacitor $C_{ST}$.

The LC capacitor $C_{LC}$ includes a pixel electrode 190, provided on the lower panel 100, and a common electrode 270, provided on the upper panel 200, as two terminals. The LC layer 3, interposed between the two electrodes 190 and 270, functions as a dielectric of the LC capacitor $C_{LC}$. The pixel electrode 190 is connected to the switching element Q, and the common electrode 270 covers an entire surface, or substantially the entire surface, of the upper panel 200 and is supplied with a common voltage Vcom. Alternatively, the pixel electrode 190 and the common electrode 270 may both be provided on the lower panel 100, and at least one of the pixel electrode 190 and the common electrode 270 may have shapes of bars or stripes.

The storage capacitor $C_{ST}$ is an auxiliary capacitor for the LC capacitor $C_{LC}$. The storage capacitor $C_{ST}$ includes the pixel electrode 190 and a separate signal line (not shown), which is provided on the lower panel 100, overlaps the pixel electrode 190 via an insulator. The separate signal line is supplied with a predetermined voltage such as the common voltage Vcom. Alternatively, the storage capacitor $C_{ST}$ includes the pixel electrode 190 and an adjacent gate line called a previous gate line, which overlaps the pixel electrode 190 via an insulator.

For color display, each pixel uniquely represents one of three colors such as red, green, and blue colors or sequentially represents the three colors in time, thereby obtaining a desired color. The three colors may be primary colors, or other colors not specifically described herein. FIG. 2 shows an example in which each pixel includes a color filter 230 representing one of the three colors in an area of the upper panel 200 facing an associated pixel electrode 190. Alternatively, the color filter 230 may be provided on or under the pixel electrode 190 of the lower panel 100.

As shown in FIG. 2, a light blocking film 220, such as a black matrix for preventing light loss, is formed on the upper panel 200 and has openings in areas corresponding to the pixel electrode 190 or the color filter 230.

A pair of polarizers (not shown) polarizing the light emitted from a light source unit (not shown) is attached on the outer surfaces of the panels 100 and 200 of the panel assembly 300, respectively. Alternatively, one or more polarizers may be provided.

The gray voltage generator 800 generates a plurality of gray scale voltages relating to the brightness of the LCD. The gray voltage generator 800 generates two sets of a plurality of gray voltages related to the transmittance of the pixels, and provides the gray voltages to the data driver 500. The data driver 500 applies the gray voltages, which are selected for each data line D1-Dm, by control of the signal controller 600, to the data line respectively as a data signal. The gray voltages in one set have a positive polarity with respect to the common voltage Vcom, while those in the other set have a negative polarity with respect to the common voltage Vcom.

The gate driver 400 is connected to the gate lines G1-Gn of the LC panel assembly 300, synthesizes the gate-on voltage Von and the gate off voltage Voff input from an external device to generate gate signals having combinations of the gate-on voltage Von and the gate-off voltage Voff for application to the gate lines G1-Gn. The gate driver 400 may include a plurality of integrated circuits ("ICs").

The data driver 500 is connected to the data lines D1-Dm of the LC panel assembly 300, applies data voltages selected from the gray voltages supplied from the gray voltage generator 800 to the data lines D1-Dm, and may also include a plurality of ICs.

The gate driving circuits of the gate driver 400 or the data driving circuit of the data driver 500 may be implemented as an integrated circuit ("IC") chip mounted on the LC panel assembly 300, such as in a "chip on glass" ("COG") type of mounting, or on a flexible printed circuit ("FPC") film of a tape carrier package ("TCP") type, which are attached to the LC panel assembly 300. Alternately, the drivers 400 and 500 may be integrated into the LC panel assembly 300 along with the display signal lines $G_1$-$G_n$ and $D_1$-$D_m$ and the TFT switching elements Q.

The temperature sensing unit 50 includes at least one temperature sensor 51. The temperature sensor 51 generates a temperature sensing signal Vs corresponding to the temperature sensed by the temperature sensor 51 and outputs the sensing signal Vs to the signal controller 600.

The signal controller 600 controls the gate driver 400 and the data driver 500.

Referring to FIG. 3, the LC panel assembly 300 is divided into a display region DR on which the LC layer 3 is formed and a non-display region B. The non-display region B mainly corresponds to the border of the LC panel assembly 300, adjacent an outermost periphery of the LC panel assembly 300, and is covered by the light blocking film 220, such as a black matrix. The temperature sensors 51 of the temperature sensing unit 50 are installed on the non-display region B. As shown in FIG. 3, the temperature sensors 51 are installed two by two on an upper and a lower part of the LC panel assembly 300, respectively. In other words, two temperature sensors 51 are installed on a first border portion of the LC panel assembly 300, and two temperature sensors 51 are installed on a second border portion of the LC panel assembly 300, where the first border portion is opposite the second border portion. However, the number of the temperature sensors 51 and the installed positions are not limited to the illustrated embodiment. For example, the temperature sensors 51 may be installed on a left and a right of the LC panel assembly 300 to sense a temperature of the LC panel assembly 300, and other alternative arrangements and quantities of temperature sensors 51 would also be within the scope of these embodiments.

Now, the operation of the LCD will be described in detail.

The signal controller 600 is supplied with RGB image signals R, G, and B and input control signals controlling the display thereof such as a vertical synchronization signal Vsync, a horizontal synchronization signal Hsync, a main clock signal MCLK, a data enable signal DE, etc., from an external graphic controller (not shown). In response to the input image signals R, G, and B and the input control signals, the signal controller 600 processes the image signals R, G, and B suitably for the operation of the LC panel assembly 300 on the basis of the input control signals and a temperature sensing signals Vs, and generates gate control signals CONT1 and data control signals CONT2. The signal controller 600 then provides the gate control signals CONT1 to the gate driver 400, and the processed image signals R', G', and B' and the data control signals CONT2 to the data driver 500.

The gate control signals CONT1 include a vertical synchronizing start signal, a scanning start signal STV, for informing the beginning of a frame and having instructions to start scanning, and at least one gate clock signal for controlling the output time of the gate-on voltage Von. The gate control signals CONT1 may further include an output enable signal OE for defining the duration of the gate-on voltage Von.

The data control signals CONT2 include a horizontal synchronization start signal STH for informing the data driver 500 of the start of data transmission for a group of pixels, a load signal LOAD having instructions to apply the data voltages to the data lines D1-Dm, and a data clock signal HCLK. The data control signal CONT2 may further include an inversion signal RVS for reversing the polarity of the data voltages (with respect to the common voltage Vcom).

In response to the data control signals CONT2 from the signal controller 600, the data driver 500 receives a packet of the image data DAT, the processed image signals, for the group of pixels from the signal controller 600, converts the image data DAT into analog data voltages selected from the gray voltages supplied from the gray voltage generator 800, and applies the data voltages to the data lines D1-Dm.

The gate driver 400 applies the gate-on voltage Von to the gate lines G1-Gn in response to the gate control signals CONT1 from the signal controller 600, thereby turning on the switching elements Q connected thereto. The data voltages applied to the data lines D1-Dm are supplied to the corresponding pixels through the activated switching elements Q.

The difference between the data voltage applied to the pixel and the common voltage Vcom is represented as a charged voltage across the LC capacitor $C_{LC}$, which is referred to as a pixel voltage. The LC molecules in the LC capacitor $C_{LC}$ have orientations depending on the magnitude of the pixel voltage, and the molecular orientations determine the polarization of light passing through the LC layer 3. The polarizer(s) converts the light polarization into light transmittance.

By repeating this procedure by a unit of the horizontal period (which is denoted by "1H" and equal to one period of the horizontal synchronizing signal Hsync, the data enable signal DE, and the gate clock signal CPV), all gate lines G1-Gn are sequentially supplied with the gate-on voltage Von during a frame, thereby applying the data voltages to all pixels. When the next frame starts after finishing one frame, the inversion control signal RVS, part of the data control signals CONT2, applied to the data driver 500 is controlled such that the polarity of the data voltages is reversed (which is referred to as "frame inversion"). The inversion control signal RVS may also be controlled such that the polarity of the data voltages flowing in a data line in one frame is reversed (for example, line inversion and dot inversion), or the polarity of the data voltages in one packet is reversed (for example, column inversion and dot inversion).

Now, structures of an exemplary embodiment of a sensor and an exemplary embodiment of an LCD having the sensor according to the present invention will be described with reference to FIGS. 4 to 5B.

Figure 4:
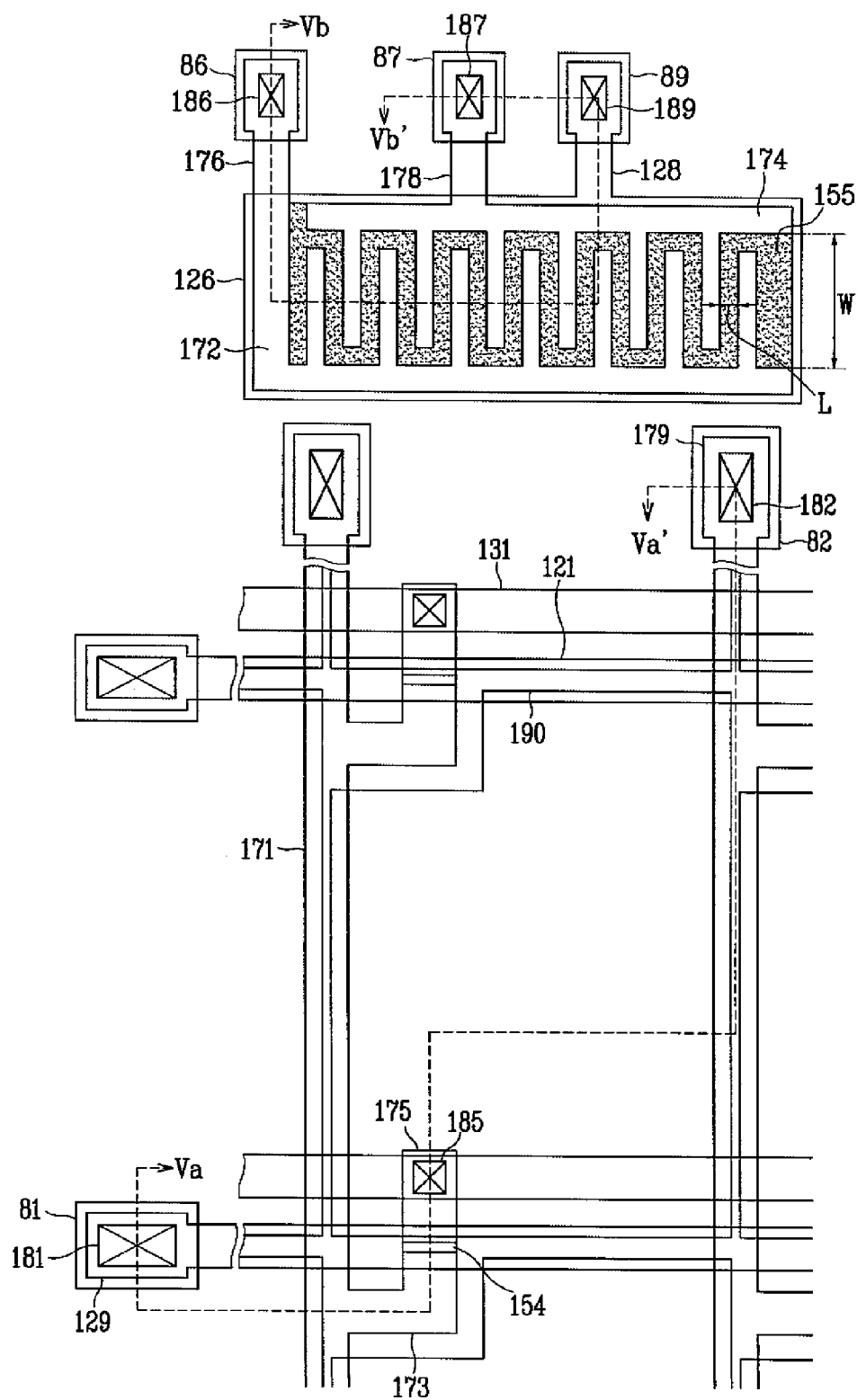
FIG. 4 is a layout view of an exemplary embodiment of an LCD according to the present invention.
Figure 5A:
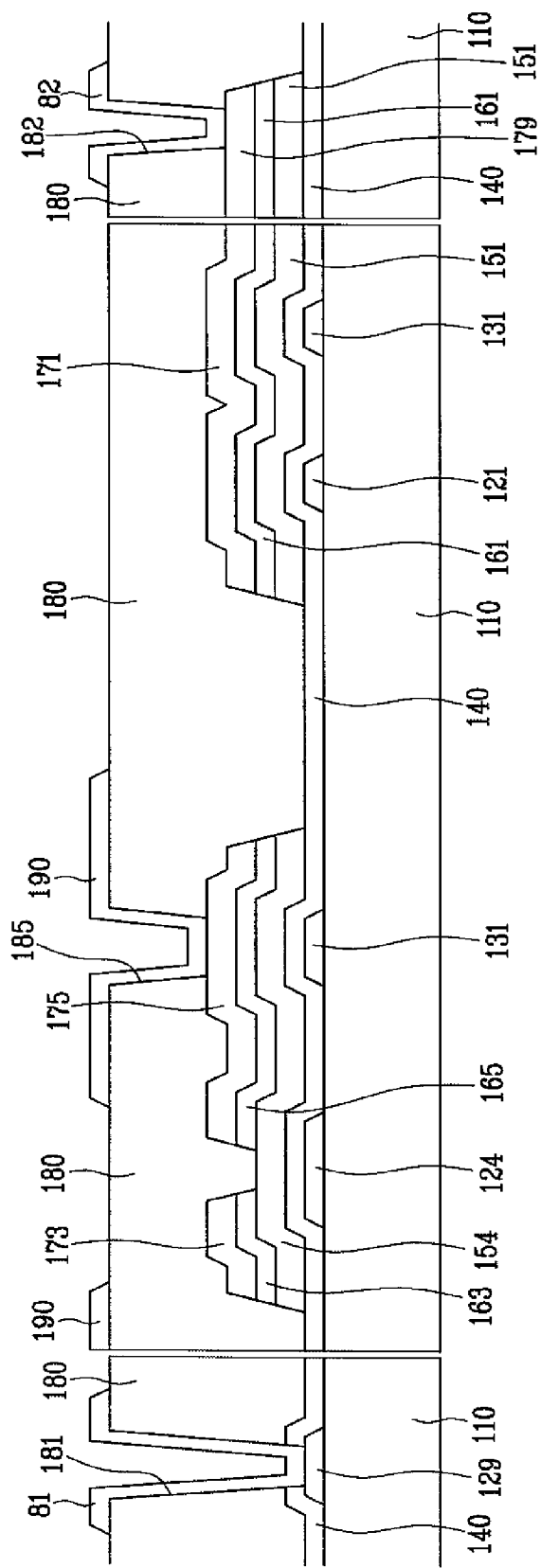
FIG. 5A is a sectional view of the LCD shown in FIG. 4 taken along line VA-VA'.
Figure 5B:
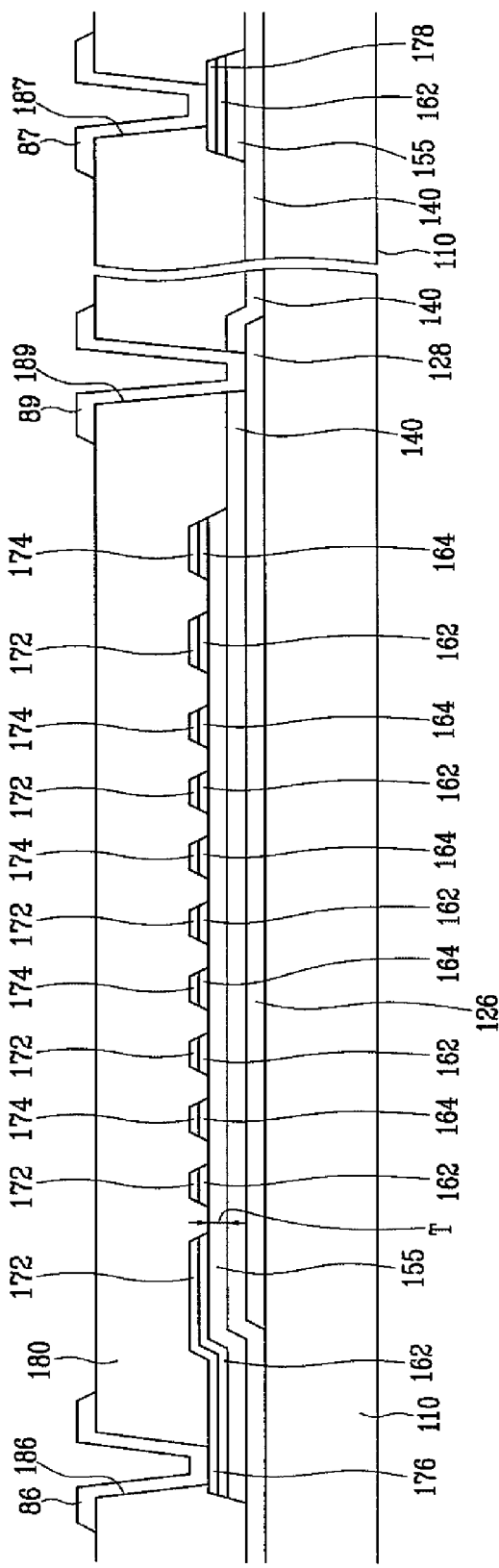
FIG. 5B is a sectional view of the LCD shown in FIG. 4 taken along line VB-VB'.

FIG. 4 is a layout view of an exemplary embodiment of an LCD according to the present invention, FIG. 5A is a sectional view of the LCD shown in FIG. 4 taken along line VA-VA', and FIG. 5B is a sectional view of the LCD shown in FIG. 4 taken along line VB-VB'.

A plurality of gate lines 121, a sensor control electrode 126, a sensor control line 128, and a plurality of storage electrode lines 131 are formed on an insulating substrate 110 such as transparent glass or other suitable transparent insulating material.

The gate lines 121 extend substantially in a transverse direction and are separated from each other and transmit gate signals. The gate lines 121 may extend substantially parallel to each other. Each gate line 121 includes a plurality of projections forming a plurality of gate electrodes 124 and an end portion 129 having a large area for contact with another layer or an external driving circuit. The gate lines 121 may extend to be connected to a driving circuit that may be integrated on the insulating substrate 110.

The sensor control electrode 126 has a substantially rectangular shape having a horizontal side longer than a vertical side, where the horizontal side of the sensor control electrode 126 may extend along the transverse direction of the insulating substrate 110 and the vertical side of the control electrode 126 may extend along a longitudinal direction across the insulating substrate 110. The sensor control line 128 may extend in the longitudinal direction, with respect to the sensor control electrode 126. While a specific arrangement of the sensor control electrode 126 is illustrated, the sensor control electrode 126 may be positioned in alternate peripheral areas of the insulating substrate 110 as previously described with respect to FIG. 3. The sensor control line 128 includes an end portion having a large area for contact with another layer or an external driving circuit.

Each of the storage electrode lines 131 which are separated from the gate lines 121 also extends substantially in the transverse direction and is disposed between two adjacent gate lines 121. The storage electrode lines 131 are supplied with a predetermined voltage such as the common voltage of the other panel (not shown).

The gate lines 121, the sensor control electrode 126, the sensor control line 128, and the storage electrode lines 131 are preferably made of an aluminum Al-containing metal such as Al and an Al alloy, a silver Ag-containing metal such as Ag and an Ag alloy, a copper Cu-containing metal such as Cu and a Cu alloy, a molybdenum Mo-containing metal such as Mo and a Mo alloy, chromium Cr, titanium Ti, or tantalum Ta. The gate lines 121, the sensor control electrode 126, the sensor control line 128, and the storage electrode lines 131 may have a multi-layered structure including two films having different physical characteristics. If a two film structure is employed, one of the two films is preferably made of a low resistivity metal including an Al-containing metal for reducing signal delay or voltage drop in the gate lines 121, the sensor control electrode 126, the sensor control line 128, and the storage electrode lines 131. The other film is preferably made of a material such as Cr, Mo, a Mo alloy, Ta, or Ti, which has good physical, chemical, and electrical contact characteristics with other materials such as indium tin oxide (ITO) or indium zinc oxide (IZO). Some examples of the combination of the two films that provide an appropriate combination of preferable characteristics include a lower Cr film and an upper Al (Al—Nd alloy) film and a lower Al (Al alloy) film and an upper Mo film.

In addition, the lateral sides of the gate line 121, the sensor control electrode 126, the sensor control line 128, and the storage line 131 are tapered, and the inclination angle of the lateral sides with respect to a surface of the substrate 110 is within a range of about 30 to about 80 degrees.

A gate insulating layer 140, preferably made of silicon nitride (SiNx), is formed on the gate lines 121, the sensor control electrode 126, the sensor control line 128, and the storage electrode lines 131 and is also formed on the portions of the insulating substrate 110 not covered by the gate lines 121, the sensor control electrode 126, the sensor control line 128, and the storage electrode lines 131.

A plurality of semiconductor stripes 151, a plurality of semiconductor islands, and a semiconductor rectangle 155, preferably made of hydrogenated amorphous silicon (abbreviated to "a-Si"), are formed on the gate insulating layer 140. Each semiconductor stripe 151 extends substantially in a longitudinal direction, extending generally perpendicularly to the storage electrode lines 131 and the gate lines 121, and has a plurality of projections 154 branched out toward the gate electrodes 124 and a plurality of protrusions disposed on the storage electrode lines 131. The semiconductor rectangle 155 is separated from the semiconductor stripes 151 and has a shape substantially similar to that of the sensor control electrode 126.

A plurality of ohmic contact stripes 161 and a plurality of ohmic contact islands 165 are formed on the semiconductor stripes 151, and a plurality of ohmic contact islands 162 and 164 are formed on the semiconductor rectangle 155. The ohmic contact stripes 161 and islands 165, 162, and 164 are preferably made of silicide or n+hydrogenated a-Si heavily doped with an n-type impurity. Each ohmic contact stripe 161 has a plurality of projections 163, and the projections 163 and the ohmic contact islands 165 are located in pairs on the projections 154 of the semiconductor stripes 151.

The ohmic contact islands 162 and 164 are located on the semiconductor rectangle 155, respectively, and are separated from each other.

The lateral sides of the semiconductor stripes 151, the semiconductor rectangle 155, and the ohmic contact stripes 161 and islands 165, 162, and 164 are tapered, and the inclination angles thereof with respect to the insulating substrate 110 are preferably in a range between about 30 to about 80 degrees.

A plurality of data lines 171, a plurality of drain electrodes 175, a sensor input electrode 172, a sensor input line 176, a sensor output electrode 174, and a sensor output line 178 are formed on the ohmic contact stripes 161 and islands 165 and the gate insulating layer 140.

The data lines 171 for transmitting data voltages extend substantially in the longitudinal direction and cross over the gate lines 121 and the storage electrode lines 131. Each data line 171 has an end portion 179 having a large area for contact with another layer or an external device. A plurality of branches of each data line 171, which project toward the drain electrodes 175, form a plurality of source electrodes 173.

The sensor input line 176 substantially extends in a longitudinal direction, such as parallel to the sensor control line 128, and the sensor input electrode 172 includes a connection portion connected to the sensor input line 176, a transverse portion extending in the transverse direction substantially perpendicular to the longitudinal direction and connected to the connection portion, and a plurality of branches extending from the connection portion via the transverse portion, the branches extending in the longitudinal direction like a comb.

The sensor output line 178 substantially extends in the longitudinal direction, such as parallel to the sensor input line 176 and the sensor control line 128, and the sensor output electrode 174 includes a connection portion connected to the sensor output line 178, a transverse portion extending in the transverse direction substantially perpendicular to the longitudinal direction and connected to the connection portion, and a plurality of branches extending from the connection portion via the transverse portion, the branches extending in the longitudinal direction like a comb.

The branches of the sensor input electrode 172 and the sensor output electrode 174 are alternately engaged through the semiconductor rectangle 155.

Each set of a gate electrode G 124, a source electrode S 173, and a drain electrode D 175 along with a projection 154 of a semiconductor stripe 151 form a TFT having a channel formed in the semiconductor projection 154 disposed between the source electrode S 173 and the drain electrode D 175.

The sensor control electrode 126, the sensor input electrode 172, and the sensor output electrode 174 along with the semiconductor rectangle 155 form a sensor transistor for a temperature sensor 51. The specifications of the sensor transistor are defined by a width W and a length L of the electrodes 126 and 172, and a thickness T of the semiconductor rectangle 155.

The data lines 171, the source electrode 173, the drain electrode 175, the sensor input line 176, the sensor input electrode 172, the sensor output line 178, and the sensor output electrode 174 are preferably made of a refractory metal including Cr, Mo, TV Ta, or alloys thereof. They may have a multi-layered structure, preferably including a low resistivity film and a good contact film.

The semiconductor stripes 151 of the TFT array panel according to this embodiment have almost the same planar shapes as the data lines 171 and the drain electrodes 175 as well as the underlying ohmic contacts 161 and 165. However, the projections 154 of the semiconductor stripes 151 include some exposed portions, which are not covered with the data lines 171 and the drain electrodes 175, such as portions located between the source electrodes 173 and the drain electrodes 175.

Similar to the gate lines 121, the data lines 171, the source electrode 173, the drain electrodes 175, the sensor input line 176, the sensor input electrode 172, the sensor output line 178, and the sensor output electrode 174 have tapered lateral sides, and the inclination angles thereof are in a range of about 30 to about 80 degrees with respect to the insulating substrate 110.

A passivation layer 180 is formed on the data lines 171, the source electrodes 173, the drain electrodes 175, the sensor input line 176, the sensor input electrode 172, the sensor output line 178, the sensor output electrode 174, and the exposed portions of the semiconductor stripes 151 and semiconductor rectangle 155, as well as any other exposed portions of the gate insulating layer 140.

The passivation layer 180 is preferably made of a photosensitive organic material having a good flatness characteristic, a low dielectric insulating material such as a-Si:C:O and a-Si:O:F formed by plasma-enhanced chemical vapor deposition ("PECVD"), or an inorganic material such as silicon nitride and silicon oxide. The passivation layer 180 may have a double-layered structure including a lower inorganic film and an upper organic film.

The passivation layer 180 has a plurality of contact holes 182, 185, 186, and 187 exposing the end portions 179 of the data lines 171, the drain electrodes 175, and end portions of the sensor input line 176 and the sensor output line 178, respectively. The passivation layer 180 and the gate insulating layer 140 also have a plurality of contact holes 181 and 189 exposing the end portions 129 of the gate lines 121 and the end portion of the sensor control line 128, respectively.

A plurality of pixel electrodes 190 and a plurality of contact assistants 81, 82, 86, 87, and 89, which are preferably made of IZO or ITO, are formed on the passivation layer 180. The contact assistants 81, 82, 86, 87, and 89 are formed with respect to the contact holes formed in the passivation layer 180.

The pixel electrodes 190 are physically and electrically connected to the drain electrodes 175 through the contact holes 185 such that the pixel electrodes 190 receive the data voltages from the drain electrodes 175.

The pixel electrodes 190 supplied with the data voltages generate electric fields in cooperation with the common electrode 270 on the upper panel 200, which reorient liquid crystal molecules in the liquid crystal layer 3 disposed therebetween.

The pixel electrodes 190 may optionally overlap the gate lines 121 and the data lines 171 to increase the aperture ratio.

The contact assistants 81, 82, 86, 87, and 89 are connected to the exposed end portions 129 of the gate lines 121, the exposed end portions 179 of the data lines 171, the exposed end portion of the sensor input line 176, the exposed end portion of the sensor output line 178, and the exposed end portion of the sensor control line 128 through the contact holes 181, 182, 186, 187, and 189, respectively. While not required, the contact assistants 81, 82, 86, 87, and 89 are preferred to protect the exposed end portions and to complement the adhesiveness of the exposed portion and external devices.

The contact assistant 81 plays a part in connecting the end portions 129 of the gate lines 121 and the gate driver 400 when the gate driver 400 to supply gate signals is integrated on the insulating substrate 110, and may alternatively be omitted.

According to another embodiment of the present invention, the pixel electrodes 190 are made of a transparent conductive polymer. For a reflective LCD, the pixel electrodes 190 are made of an opaque reflective metal. In these cases, the contact assistants 81 and 82 may be made of a material such as IZO or ITO different from the pixel electrodes 190.

A size of the temperature sensor 51 integrated along with the gate lines 121 and the data lines 171 upon the insulating substrate 110 and varying an operating state or a resistance value thereof based on the sensed temperature may be about 2 mm×2 mm or less. In addition, the sensor control electrode 126 formed on the substrate 110 functions to block light from a light source (not shown) disposed below a lower part of the LC panel assembly 300. Such a feature does not limit light transmittance of the LC panel assembly 300, however, since the positioning of the temperature sensor 51 is generally limited to the non-display region B.

Exemplary embodiments of the temperature sensor 51 formed with the gate lines 121 and the data lines 171 on the non-display region B of the LC panel assembly 300 include a diode type of temperature sensor and a resistor type of temperature sensor, as shown in FIGS. 6A to 7B, in accordance with the connection of the sensor control line 128, the sensor input line 176, and the sensor output line 178, as further described below.

Figure 6A:
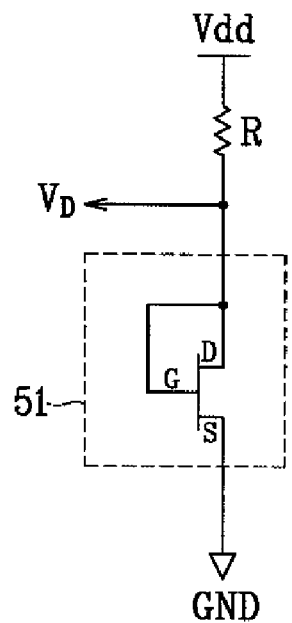
FIG. 6A is an equivalent circuit diagram of one exemplary embodiment of a diode type of temperature sensor that may be used in an embodiment of the present invention.
Figure 6B:
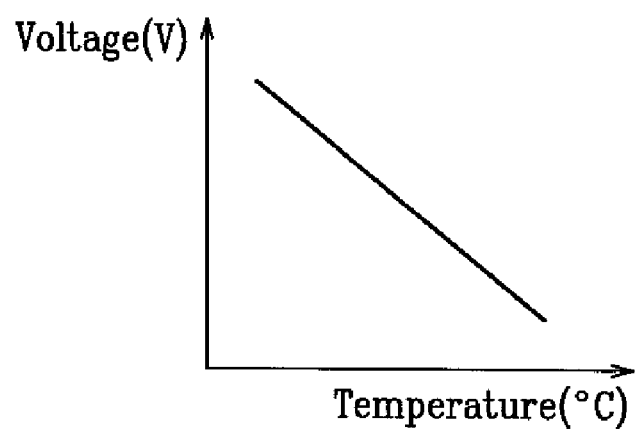
FIG. 6B is a graph showing a characteristic of an output voltage with respect to a temperature variation of the diode type of temperature sensor shown in FIG. 6A.
Figure 7A:
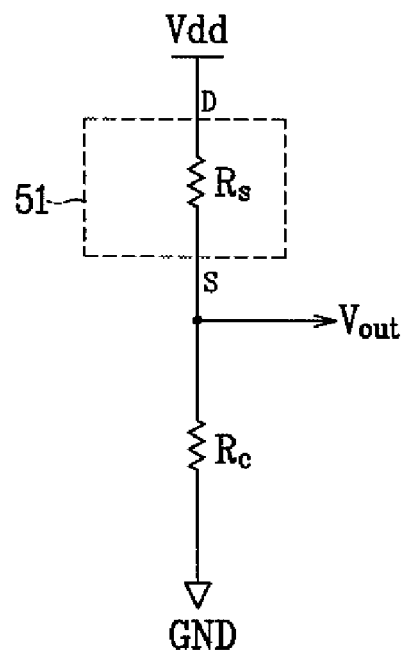
FIG. 7A is an equivalent circuit diagram of one exemplary embodiment of a resistor type of temperature sensor that may be used in an embodiment of the present invention.
Figure 7B:
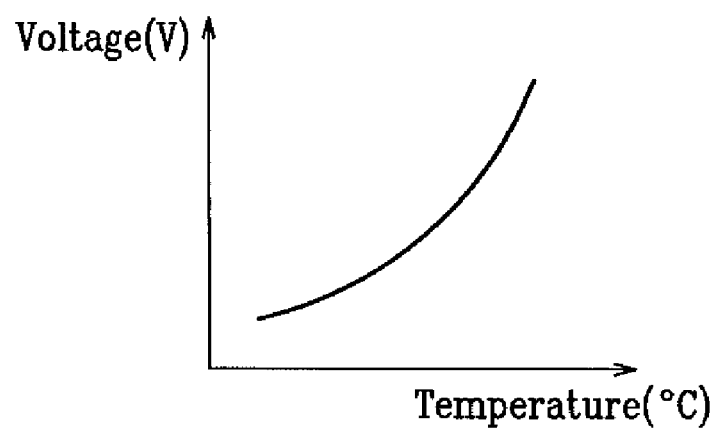
FIG. 7B is a graph showing a characteristic of an output voltage with respect to a temperature variation of the resistor type of temperature shown in FIG. 7A.

FIG. 6A is an equivalent circuit diagram of an exemplary embodiment of a diode type of temperature sensor when a temperature sensor according to an exemplary embodiment of the present invention is the diode type of temperature sensor, and FIG. 6B is a graph showing a characteristic of an output voltage with respect to a temperature variation of the diode type of temperature sensor shown in FIG. 6A. FIG. 7A is an equivalent circuit diagram of an exemplary embodiment of a resistor type of temperature sensor when a temperature sensor according to an exemplary embodiment of the present invention is the resistor type of temperature sensor, and FIG. 7B is a graph showing a characteristic of an output voltage with respect to a temperature variation of the resistor type of temperature sensor shown in FIG. 7A.

An exemplary embodiment of when lines 128, 176, and 178 of the temperature sensor 51 are connected as a diode type of temperature sensor will be described with reference to FIGS. 6A and 6B.

Referring to FIG. 6A, a sensor control line G 128 of the temperature sensor 51 is connected to a sensor output line D 178, and the sensor input line S 176 of the temperature sensor 51 is connected to a ground GND such that a sensor transistor, that is, the temperature sensor 51, functions as a diode.

At this time, an output voltage $V_D$ from the sensor output line D 178 is represented as:

$$V_D = V_{dd} - RI_D \quad \text{[Equation 1]}$$

Here, $I_D$ is a current flowing through the sensor output line D 178, R is a resistor connected to an exterior of the temperature sensor 51, and Vdd is an input voltage.

At this time, for a voltage between the sensor control line G 128 and sensor input line S 176 and a voltage between the sensor output line D 178 and the sensor input line S 176 by the connection between the sensor control line G 128 and the sensor output line D 178, the $I_D$ is expressed as:

$$I_D = \mu_n C_g \frac{W}{L}\left(\frac{V_D^2}{2} - V_{TH} V_D\right) \quad \text{[Equation 2]}$$

Here, $\mu_n$ is electron mobility depending on a temperature variation, Cg is capacitance of the sensor input electrode 172, W is a channel width, L is a channel length, where W and L are measured such as shown in FIG. 4, and $V_{TH}$ is a threshold voltage.

The electron mobility $\mu_n$ is represented as:

$$\mu_n = \mu_0 \frac{N_C kT}{n} e^{-E_a/kT} \quad \text{[Equation 3]}$$

Here, $\mu_0$ is extended state electron mobility, Nc is a state density at mobility edge, k is a Boltzmann constant, T is a temperature (K), n is total electron density, and Ea is activation energy. In one embodiment, $\mu_0$ is ~6[cm$^2$/vs], Nc is ~2×10$^{21}$[cm$^2$/eV], k is 1.3805×10$^{-23}$[J/K], and Ea is 0.13 [eV].

As a result, with reference to [Equation 1] to [Equation 3], the output voltage $V_D$ is varied based on a temperature variation.

The output voltage $V_D$ of the temperature sensor 51 having the equivalent circuit shown in FIG. 6A is linearly varied as a temperature is changed, as shown in FIG. 6B.

An exemplary embodiment of when lines 128, 176, and 178 of the temperature sensor 51 are connected as a resistor type of temperature sensor will be described with reference to FIGS. 7A and 7B.

As shown in FIG. 7A, a sensor control line G 128 is not supplied with any signals, a sensor input line S 176 is connected to a ground GND through a resistor Rc, and a sensor output line D 178 is supplied with an externally applied driving voltage Vdd. In this embodiment, since the sensor control line G 128 is not supplied with any signals, a temperature sensor 51, that is, a sensor transistor, functions as a resistor Rs.

An output voltage Vout from the temperature sensor 51, that is, a sensor transistor, is represented as:

$$Vout = \frac{Rc}{Rs + Rc} Vdd \quad \text{[Equation 4]}$$

Rs is expressed as:

$$Rs = \rho \frac{L}{WD}$$

and σ is expressed as:

$$\sigma = ne\mu_n = \frac{1}{\rho}$$

Here, e is carrier capacitance amount.

As described above, since the electron mobility $\mu_n$ is represented as [Equation 3], the output voltage Vout is varied based on a temperature variation.

The output voltage Vout with respect to a temperature variation is varied as shown in FIG. 7B. As shown in FIG. 7B, though the output voltage Vout of the resistor type of temperature sensor is nonlinearly varied, the sensitivity of the temperature sensor 51 on the basis of characteristics of a resistor is good.

In the resistor type of temperature sensor, since the sensor control line G 128 is not supplied with any signal, a sensor control line G 176 and a sensor control electrode 126 may be unnecessary.

Another exemplary embodiment of a resistor type of temperature sensor according to the present invention will be described with reference to FIGS. 8A and 8B. A structure of an LCD including the resistor type of temperature sensor may be the same as that shown in FIGS. 4 and 5A and is therefore omitted.

Figure 8A:
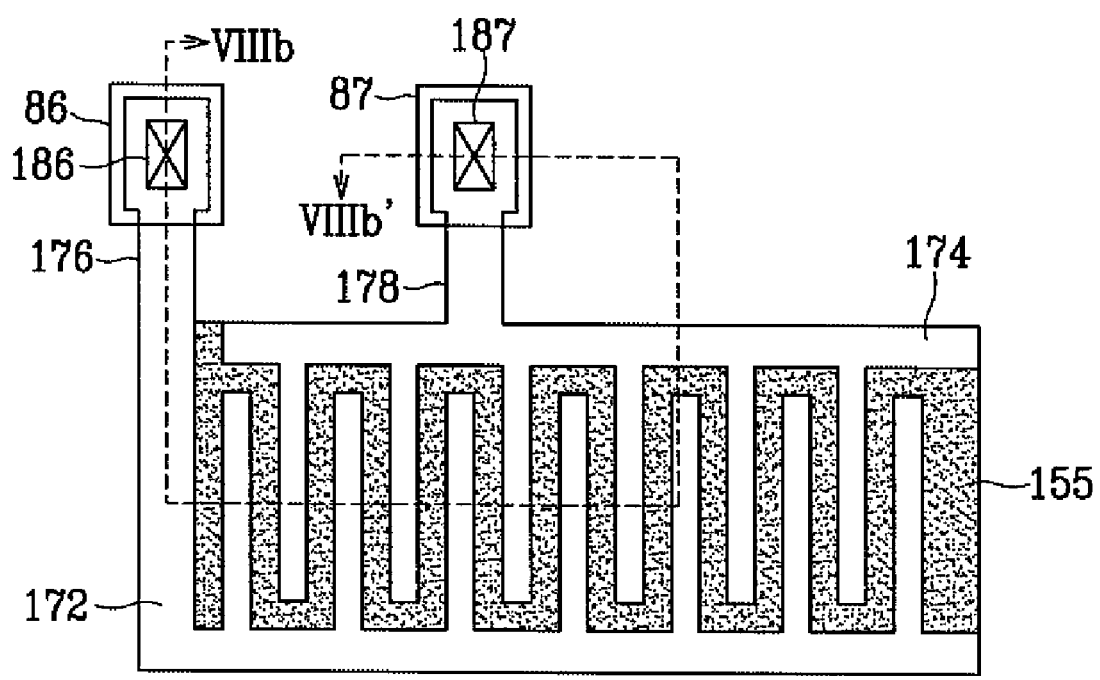
FIG. 8A is a layout view of another exemplary embodiment of a resistor type of temperature sensor according to the present invention.
Figure 8B:
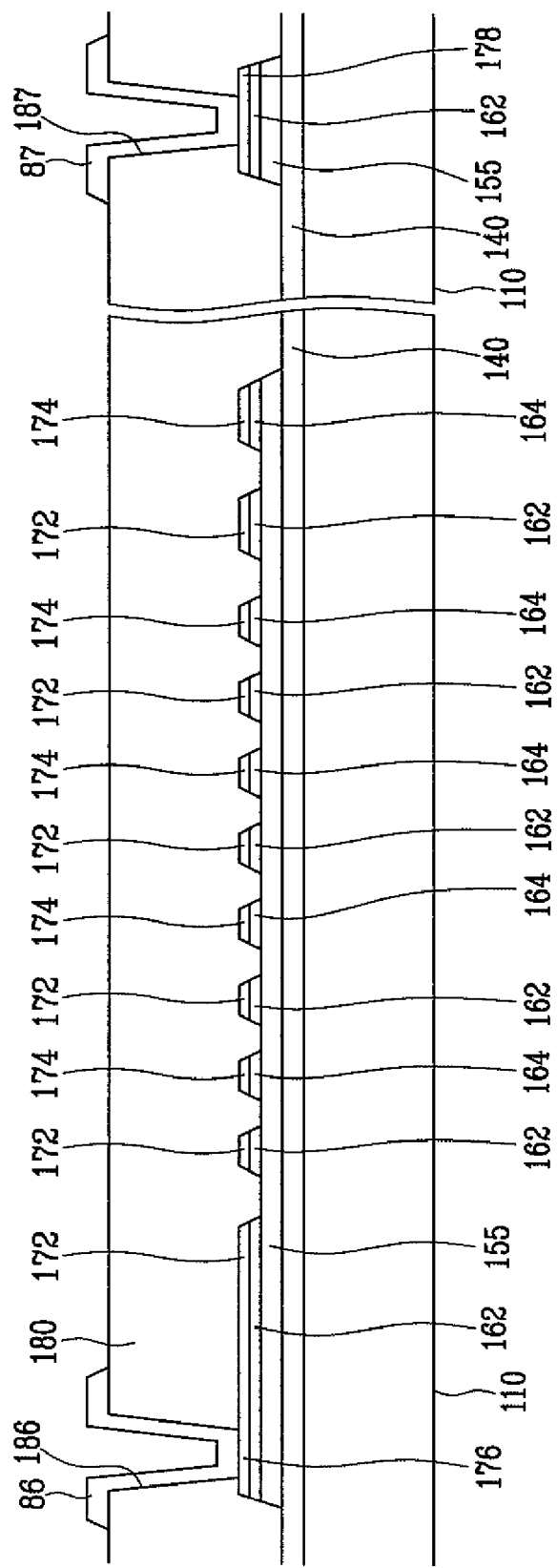
FIG. 8B is sectional view of the resistor type of temperature sensor shown in FIG. 8A taken along line VIIIB-VIIIB'.

FIG. 8A is a layout view of an exemplary embodiment of a resistor type of temperature sensor according to the present invention and FIG. 8B is a sectional view of the resistor type of temperature sensor shown in FIG. 8A taken along the VIIIB-VIIIB'.

As shown in FIGS. 8A and 8B, a structure of another exemplary embodiment of a resistor type of temperature sensor according to the present invention is similar to that shown in FIGS. 4 and 5A except that a sensor control electrode 126 and a sensor control line 128 are not formed.

That is, a gate insulating layer 140 is formed on an insulating substrate 110 (with no sensor control electrode 126 and sensor control line 128 present), and a semiconductor rectangle 155, having horizontal sides longer than vertical sides, is formed on the gate insulating layer 140. A plurality of ohmic contacts 162 and 164 are formed on the semiconductor rectangle 155. In addition, a sensor input line 176, a sensor input electrode 172, a sensor output electrode 174, and a sensor output line 178 are formed on the ohmic contacts 162 and 164 and the gate insulating layer 140.

A passivation layer 180 is formed on the sensor input line 176, the sensor input electrode 172, the sensor output electrode 174, and the sensor output line 178, as well as on any exposed portions of the gate insulating layer 140 and the semiconductor rectangle 155. The passivation layer 180 has a plurality of contact holes 186 and 187 exposing end portions of the sensor input line 176 and the sensor output line 178, respectively.

Contact assistants 86 and 87 may be formed on the passivation layer 180 in combination with the contact holes 186, 187, respectively.

As described above, a resistor type of temperature sensor is designed without the sensor control line 128 and the sensor control electrode 126 since they are not supplied with a signal.

Figure 9:
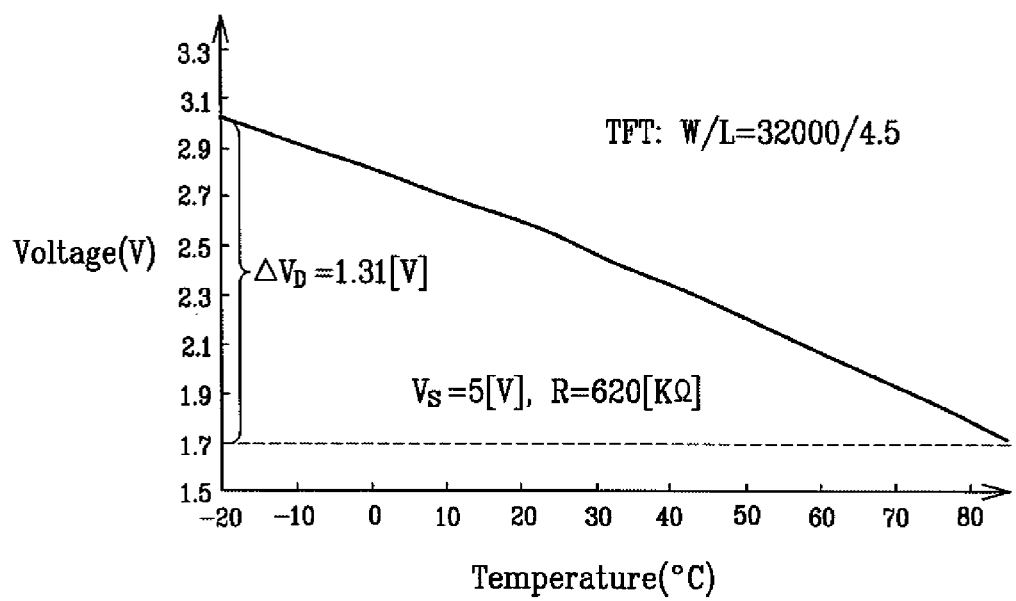
FIG. 9 is a graph showing an output voltage with respect to a temperature variation in an exemplary embodiment of a diode type of temperature sensor according to the present invention.
Figure 10:
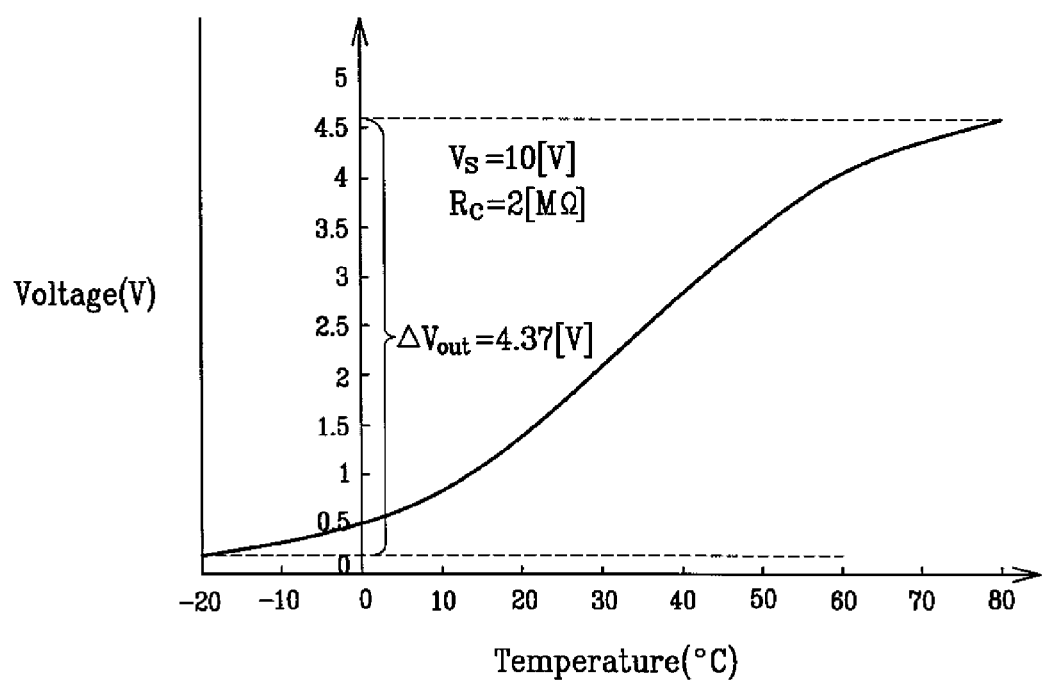
FIG. 10 is a graph showing an output voltage with respect to a temperature variation in an exemplary embodiment of a resistor type of temperature sensor according to the present invention.

For a diode type of temperature sensor and a resistor type of temperature sensor according to embodiments of the present invention, exemplary graphs of output voltages actually outputted therefrom with respect to a temperature variation are shown in FIGS. 9 and 10, respectively.

For exemplary purposes only, in FIGS. 9 and 10, a driving voltage Vdd is about 5V, and W/L is 3200/4.5. In FIG. 9, a resistance value of the resistor R is about $620^{k\Omega}$, and in FIG. 10 a resistance value of the resistor Rc is about $2^{k\Omega}$.

As shown in FIGS. 9 and 10, the range of the sensed temperature of an LCD was about −20° C. to 80° C. In FIG. 9, temperatures were sensed by a unit of about 10° C., and in FIG. 10, temperatures were sensed by a unit of about 2.5° C. In FIG. 9, a voltage variation difference $\Delta V_D$ is about 1.31V and in FIG. 10, a voltage variation difference $\Delta V_{out}$ is about 4.37V. Thus, since dynamic sensibility of the output voltages from the temperature sensors is large, the output voltages are directly used without separate signal processing such as filtering, amplifying, and so on.

The exemplary embodiments of temperature sensors according to the present invention sense an exact temperature corresponding to a temperature variation of an LC layer since the temperature sensors are directly integrated in the LC panel assembly along with the gate lines and the data lines.

According to the present invention, a temperature sensor is directly integrated in an LCD for sensing a temperature of the LCD, and thereby the temperature is exactly sensed without a large increment of a manufacturing cost. In addition, the controlling of a display device is achieved based on the exactly sensed temperature of the display device, and thereby an image quality of the display device is improved. The design is improved and manufacturing cost is decreased since a separate temperature sensor to be externally installed on the LCD is unnecessary.

Moreover, since driving characteristics of a temperature sensor are changed by changing a connection of the lines thereof and a temperature sensor having characteristics suitable for a display device and circumference environment thereof is realized, the driving efficiency of the temperature sensor and the display device is improved.

Additionally, since the size of an area of the temperature sensor contacting the surface of an LCD is increased due to the comb shape, while maintaining a small size of the temperature sensor, reliability of sensing is improved and additional circuits are unnecessary.

While the present invention has been described in detail with reference to the preferred embodiments, it is to be understood that the invention is not limited to the disclosed embodiments, but, on the contrary, is intended to cover various modifications and equivalent arrangements included within the spirit and scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. A liquid crystal display panel comprising:
    a first panel;
    a second panel;
    a liquid crystal layer disposed between the first panel and the second panel; and,
    a temperature sensor formed on a first surface of the first panel, wherein the first surface of the first panel faces the liquid crystal layer, and the temperature sensor comprises a sensor input electrode and a sensor output electrode; and
    wherein the sensor input electrode comprises a first branch and the sensor output electrode comprises a second branch, and he first branch faces the second branch in plan view.

2. The liquid crystal display panel of claim 1, wherein the first panel is a thin film transistor array panel.

3. The liquid crystal display panel of claim 1, wherein the temperature sensor is formed on a non-display region of the first panel.

4. The liquid crystal display panel of claim 1, further comprising a plurality of temperature sensors formed on the first surface of the first panel.

5. The liquid crystal display panel of claim 1, wherein the first panel includes at least one data line, and the sensor input electrode and the sensor output electrode are formed within a same layer of the first panel as the data line.

6. The liquid crystal display panel of claim 5, wherein the first panel includes a substrate and at least one gate line formed on the substrate, and the temperature sensor includes a sensor control electrode formed within the same layer of the first panel as the gate line.

7. The liquid crystal display panel of claim 1, wherein the first branch is engaged with the second branch through a semiconductor.

* * * * *